(12) United States Patent
Wang

(10) Patent No.: US 7,625,818 B2
(45) Date of Patent: Dec. 1, 2009

(54) METHOD FOR FORMING VIAS IN A SUBSTRATE

(75) Inventor: Meng-Jen Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 12/183,128

(22) Filed: Jul. 31, 2008

(65) Prior Publication Data

US 2009/0035931 A1    Feb. 5, 2009

(30) Foreign Application Priority Data

Aug. 2, 2007    (TW) .............................. 96128418 A

(51) Int. Cl.
*H01L 21/44* (2006.01)
(52) U.S. Cl. .................. 438/623; 438/667; 438/672; 257/E21.575; 257/E21.585
(58) Field of Classification Search ................. 438/672, 438/667, 637, 623; 257/E21.585, E21.575
See application file for complete search history.

(56) References Cited

U.S. PATENT DOCUMENTS

| 5,308,443 | A | * | 5/1994 | Sugihara | ...................... 216/18 |
| 5,998,292 | A | | 12/1999 | Black et al. | |
| 7,222,420 | B2 | * | 5/2007 | Moriizumi | .................... 29/830 |
| 7,276,787 | B2 | * | 10/2007 | Edelstein et al. | ............ 257/698 |
| 2004/0259292 | A1 | * | 12/2004 | Beyne et al. | ................. 438/125 |
| 2007/0048896 | A1 | | 3/2007 | Andrey et al. | |

* cited by examiner

*Primary Examiner*—Michael Trinh
(74) *Attorney, Agent, or Firm*—Volentine & Whitt, P.L.L.C.

(57) ABSTRACT

The present invention relates to a method for forming vias in a substrate, comprising the following steps: (a) providing a substrate having a first surface and a second surface; (b) forming a photo resist layer on the first surface of the substrate; (c) forming a pattern on the photo resist layer; (d) forming a groove and a pillar in the substrate according to the pattern, wherein the groove surrounds the pillar; (e) forming a polymer in the groove of the substrate; (f) removing the pillar of the substrate to form an accommodating space; (g) forming a conductive metal in the accommodating space; and (h) removing part of the second surface of the substrate to expose the conductive metal and the polymer. As a result, thicker polymer can be formed in the groove, and the thickness of the polymer in the groove is uniform.

17 Claims, 7 Drawing Sheets

METHOD FOR FORMING VIAS IN A SUBSTRATE

BACKGROUND OF THE INVENTION

1. Field of the Invention

The present invention relates to a method for forming vias in a substrate, and more particularly to a method for forming an insulation layer on the side wall of vias in a substrate by using polymer.

2. Description of the Related Art

FIGS. 1 to 3 show schematic views of a conventional method for forming vias in a substrate. First, referring to FIG. 1, a substrate 1 is provided. The substrate 1 has a first surface 11 and a second surface 12. Afterward, a plurality of grooves 13 are formed on the first surface 11 of the substrate 1. An insulation layer 14 is then formed on the side wall of the grooves 13 by chemical vapor deposition, and a plurality of accommodating spaces 15 are formed. The material of the insulation layer 14 is usually silicon dioxide.

Referring to FIG. 2, the accommodating spaces 15 are filled with a conductive metal 16. The material of the conductive metal 16 is usually copper. Finally, the first surface 11 and the second surface 12 of the substrate 1 are ground or etched so as to expose the conductive metal 16, as shown in FIG. 3.

In the conventional method, the insulation layer 14 is formed by chemical vapor deposition, so that the thickness of the insulation layer 14 on the side wall of the grooves 13 is limited, and is usually under 0.5 µm. Moreover, the thickness of the insulation layer 14 on the side wall of the grooves 13 is not uniform, that is, the thickness of the insulation layer 14 on the upper side wall of the grooves 13 is not exactly equal to that on the lower side wall of the grooves 13. Thus, the electrical capacity is not uniform.

Therefore, it is necessary to provide an innovative and advanced method for forming vias in a substrate to solve the above problems.

SUMMARY OF THE INVENTION

The present invention is directed to a method for forming vias in a substrate. The method of the invention comprises the following steps: (a) providing a substrate having a first surface and a second surface; (b) forming a photo resist layer on the first surface of the substrate; (c) forming a pattern on the photo resist layer; (d) forming a groove and a pillar in the substrate according to the pattern, wherein the groove surrounds the pillar; (e) forming a polymer in the groove of the substrate; (f) removing the pillar of the substrate to form an accommodating space; (g) forming a conductive metal in the accommodating space; and (h) removing part of the second surface of the substrate to expose the conductive metal and the polymer.

In the present invention, the polymer is used as an insulation material, so that polymers with different materials can be chosen for specific processes. Also, thicker polymer can be formed in the groove according to the method of the present invention. Moreover, the thickness of the polymer in the groove is uniform.

DETAILED DESCRIPTION OF THE INVENTION

Figure 1:
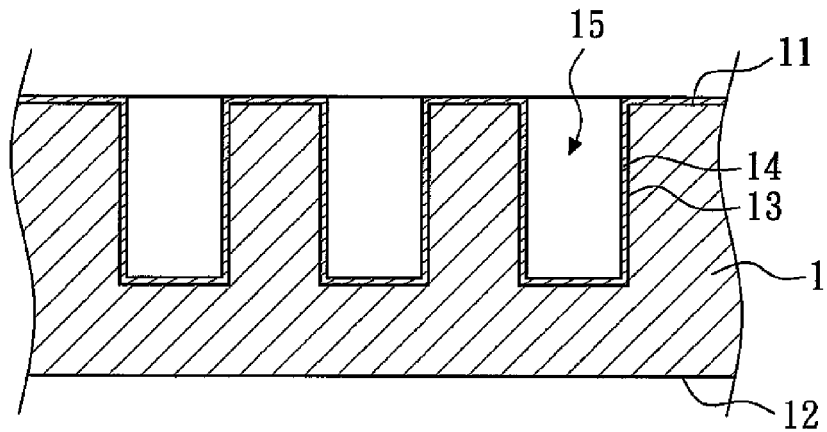
FIGS. 1 to 3 are schematic views of a conventional method for forming vias in a substrate.
Figure 2:
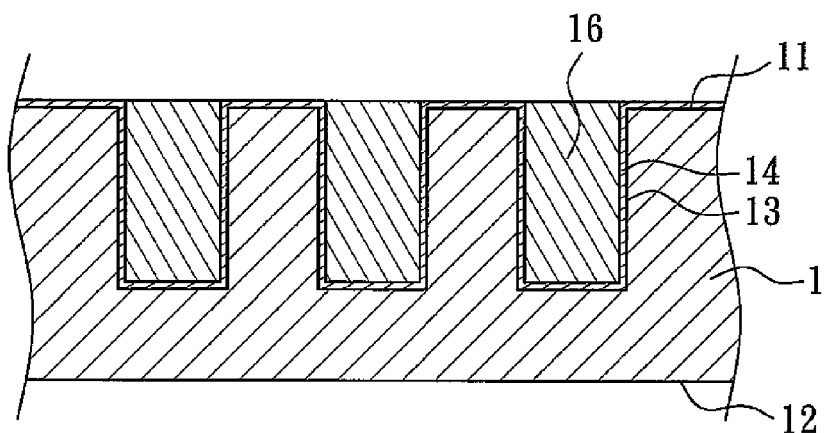
Figure 3:
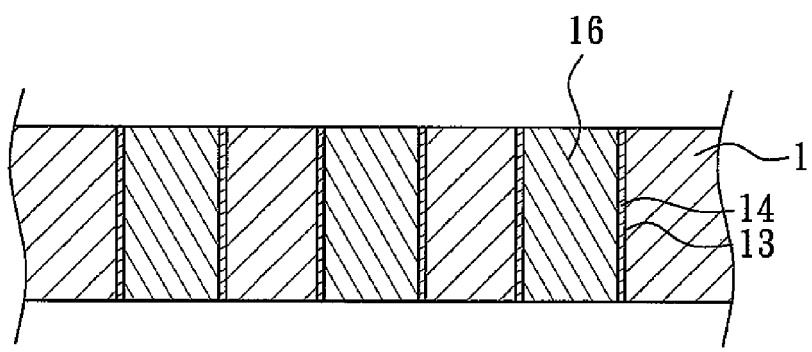
Figure 4:
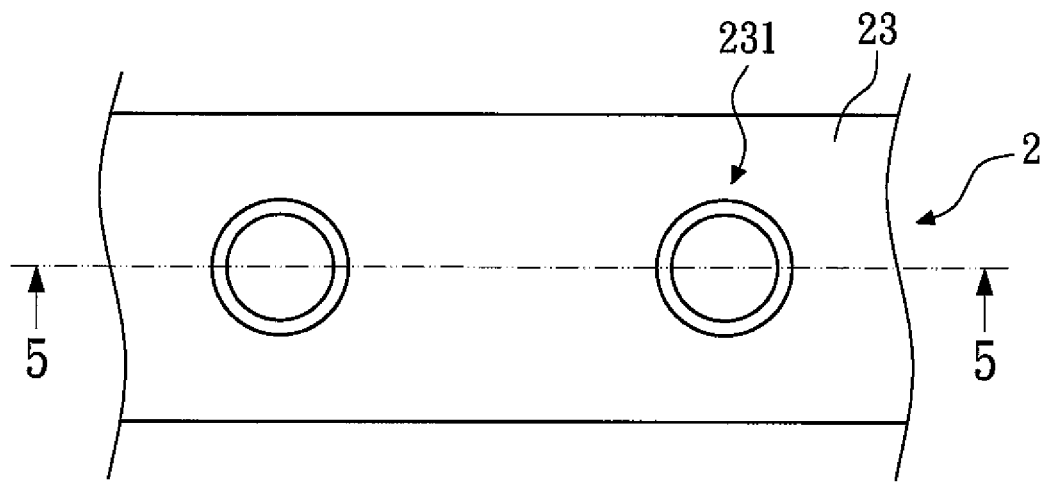
FIGS. 4 to 15 are schematic views of a method for forming vias in a substrate according to the present invention.
Figure 5:
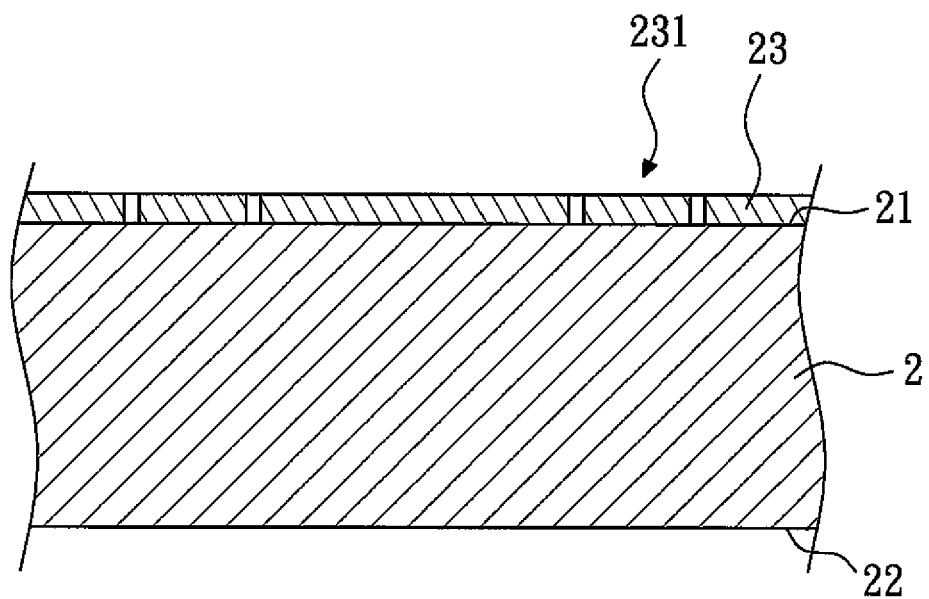

FIGS. 4 to 15 show schematic views of a method for forming vias in a substrate according to the present invention. Referring to FIG. 4, a top view of the substrate, and FIG. 5, a cross-sectional view of the substrate along line 5-5 in FIG. 4, first, a substrate 2 is provided. The substrate 2 has a first surface 21 and a second surface 22. The substrate 2 is, for example, a wafer or made from silicon. Afterward, a photo resist layer 23 is formed on the first surface 21 of the substrate 2, and a pattern 231 is formed on the photo resist layer 23. In the embodiment, the pattern 231 is an annular opening, and is circular as seen from the top view. It is understood that the annular opening of the pattern 231 may be square as seen from the top view.

Figure 6:
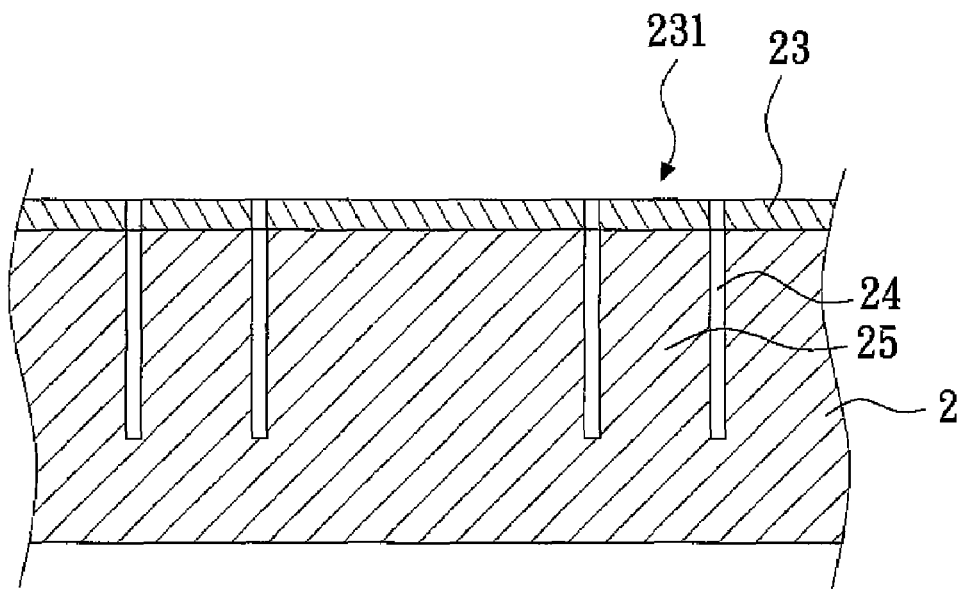

Referring to FIG. 6, a groove 24 and a pillar 25 are formed in the substrate 2 according to the pattern 231 by etching or other methods. The groove 24 surrounds the pillar 25, and does not penetrate the substrate 2. Afterward, the photo resist layer 23 is removed.

Figure 7:
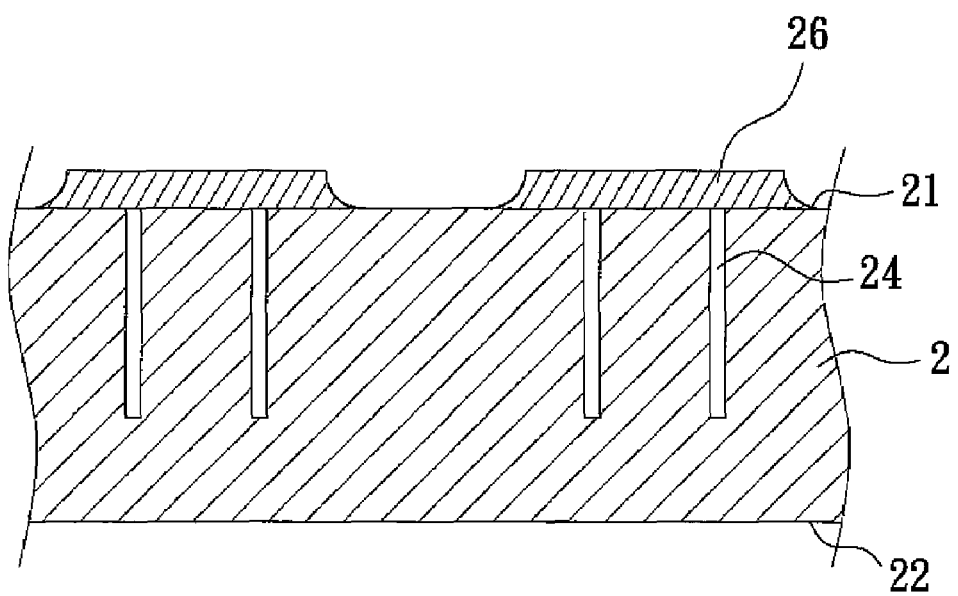
Figure 8:
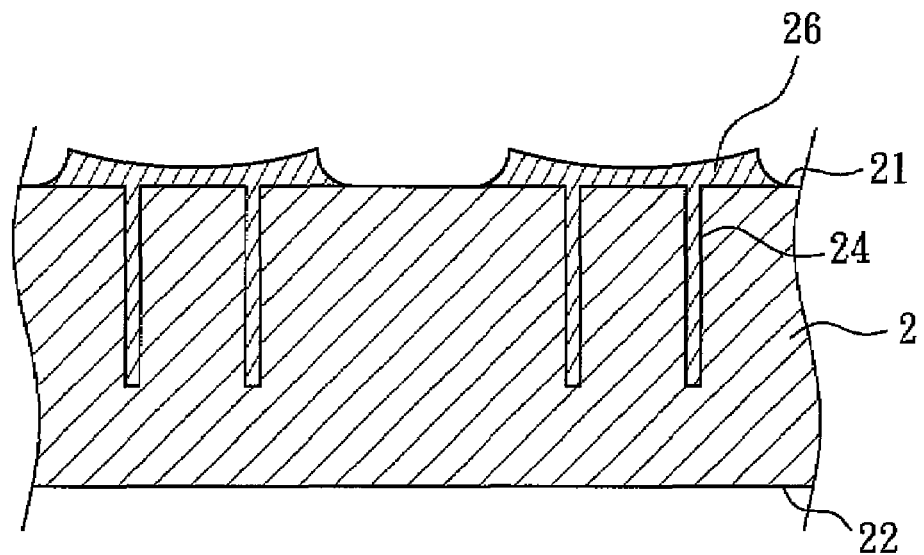
Figure 10:
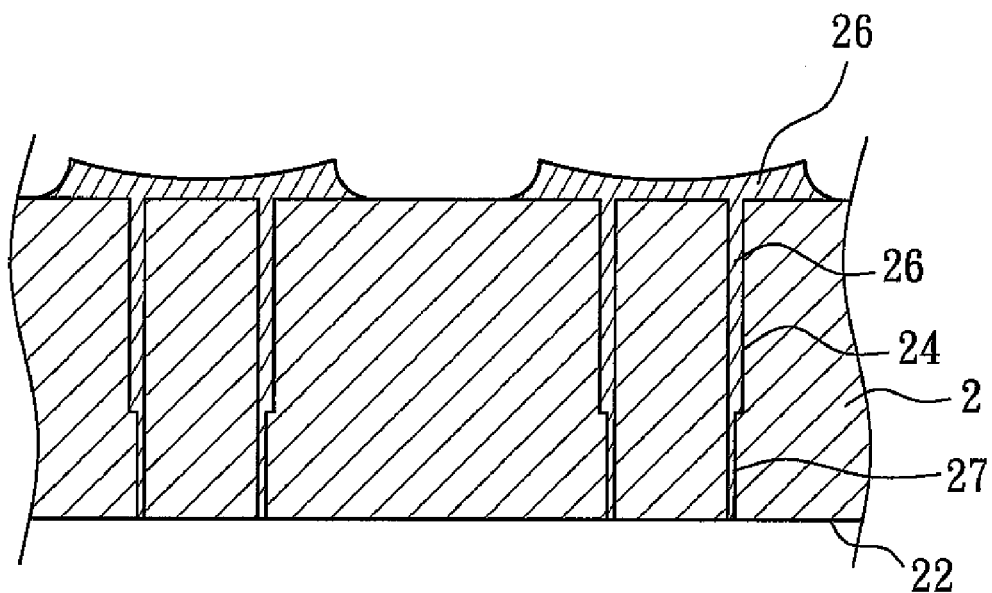
Figure 11:
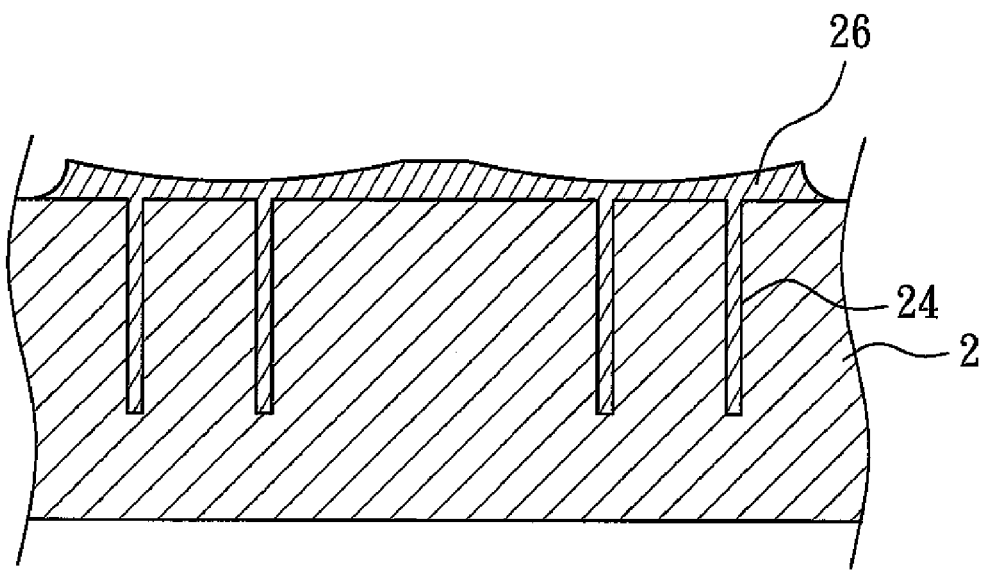
Figure 12:
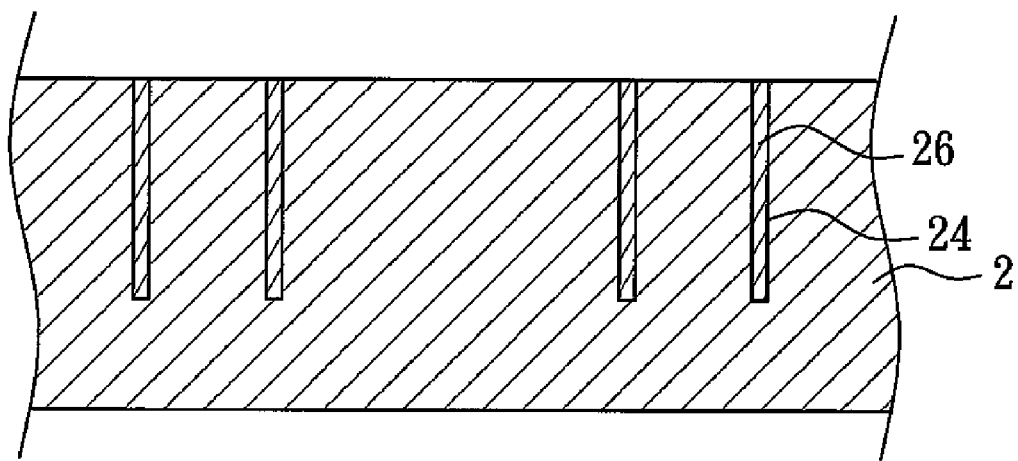

Referring to FIGS. 7 to 12, a polymer 26 is formed in the groove 24 of the substrate 2. In the present invention, the method for forming the polymer 26 in the groove 24 includes but is not limited to the following three methods. The first method is that the polymer 26 is dispersed on the first surface 21 of the substrate 2, and the position of the polymer 26 corresponds to the groove 24, as shown in FIG. 7. Afterward, the polymer 26 is impelled into the groove 24, as shown in FIG. 8. Preferably, the polymer 26 is sucked into the groove 24 by vacuuming. Finally, the part of the polymer 26 which is outside the groove 24 is removed, as shown in FIG. 12.

Figure 9:
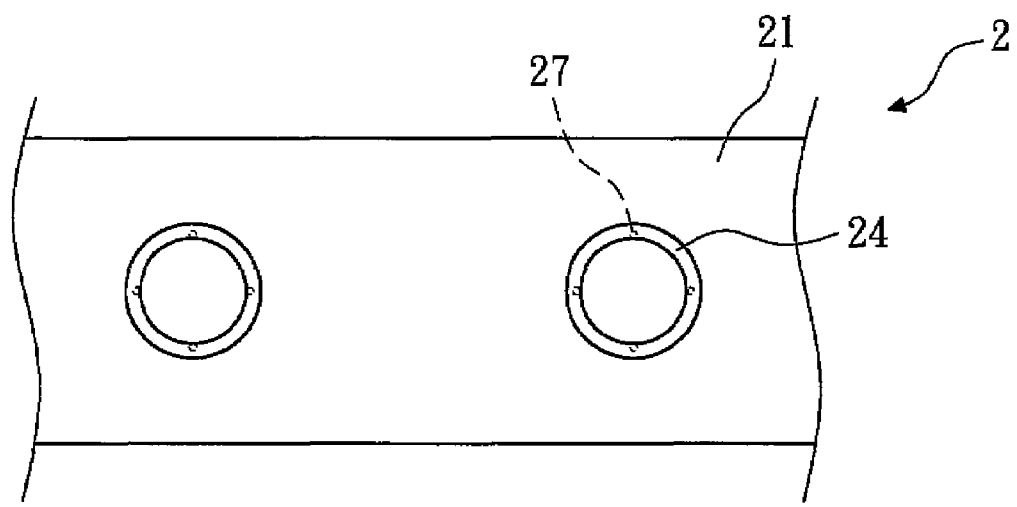

The second method is that a plurality of vents 27 are formed to connect the groove 24 to the second surface 22 of the substrate 2, as shown in the top view of FIG. 9. Afterward, the polymer 26 is dispersed on the first surface 21 of the substrate 2, and the position of the polymer 26 corresponds to the groove 24. The groove 24 and the vents 27 are then filled with the polymer 26, as shown in FIG. 10. Finally, the part of the polymer 26 which is outside the groove 24 and the vents 27 is removed.

The third method is that the polymer 26 is deposited in the groove 24 by spray coating, as shown in FIG. 11. Preferably, the polymer 26 is atomized before depositing. Finally, the part of the polymer 26 which is outside the groove 24 is removed, as shown in FIG. 12.

Figure 13:
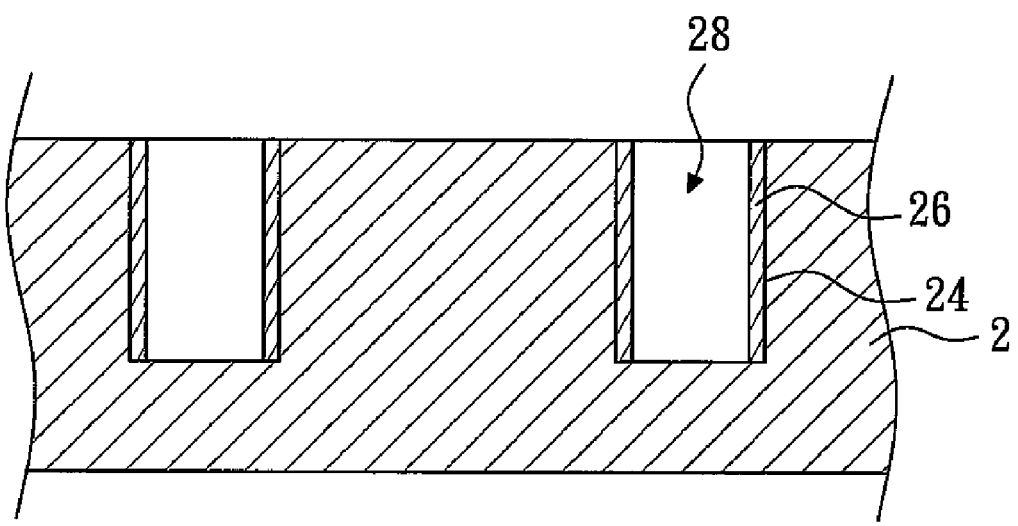
Figure 14:
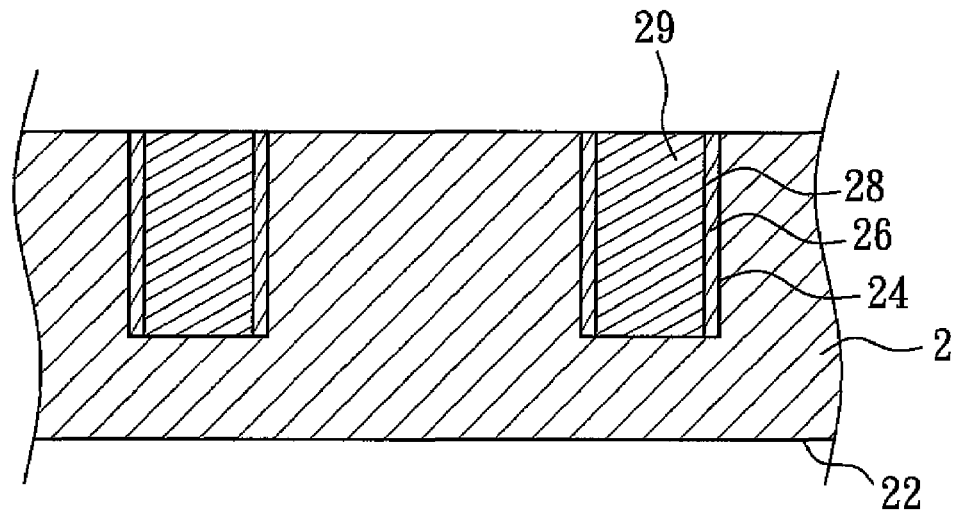
Figure 15:
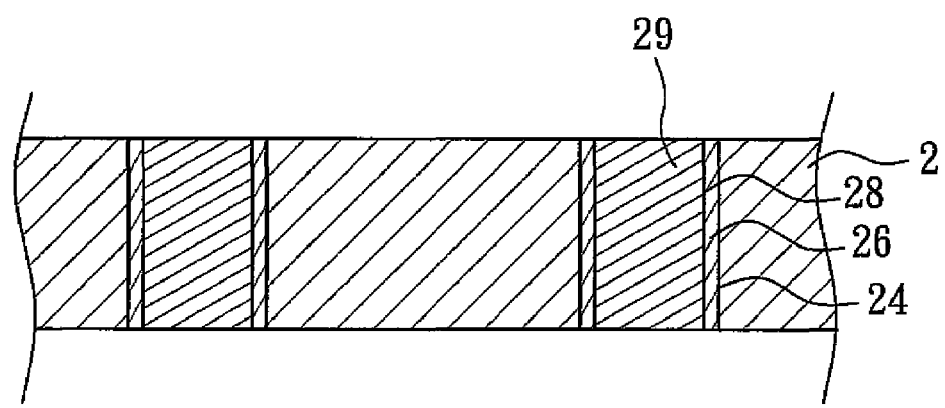

Referring to FIG. 13, the pillar 25 of the substrate 2 is removed by dry etching or wet etching to form an accommodating space 28. Referring to FIG. 14, a conductive metal 29 is then formed in the accommodating space 28. In the embodiment, the material of the conductive metal 29 is copper. Finally, referring to FIG. 15, part of the second surface 22 of the substrate 2 is removed by etching or grinding so as to expose the conductive metal 29 and the polymer 26.

In the present invention, the polymer 26 is used as an insulation material, so that polymers with different materials can be chosen for a specific process. Also, thicker polymer 26 can be formed in the groove 24 according to the method of the present invention. Moreover, the thickness of the polymer 26 in the groove 24 is uniform.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A method for forming vias in a substrate, comprising:
   (a) providing a substrate having a first surface and a second surface;
   (b) forming a photo resist layer on the first surface of the substrate;
   (c) forming a pattern on the photo resist layer;
   (d) forming a groove and a pillar in the substrate according to the pattern, wherein the groove surrounds the pillar;
   (e) forming a polymer in the groove of the substrate;
   (f) removing the pillar of the substrate to form an accommodating space;
   (g) forming a conductive metal in the accommodating space; and
   (h) removing part of the second surface of the substrate to expose the conductive metal and the polymer.

2. The method as claimed in claim 1, wherein the substrate is made from silicon.

3. The method as claimed in claim 1, wherein the substrate is a wafer.

4. The method as claimed in claim 1, wherein the pattern is an annular opening.

5. The method as claimed in claim 4, wherein the annular opening is circular as seen from the top view.

6. The method as claimed in claim 4, wherein the annular opening is square as seen from the top view.

7. The method as claimed in claim 1, wherein the groove does not penetrate the substrate.

8. The method as claimed in claim 1, wherein the groove and the pillar are formed by etching.

9. The method as claimed in claim 1, further comprising a step of removing the photo resist layer after Step (d).

10. The method as claimed in claim 1, wherein Step (e) further comprises:
    (e1) dispersing the polymer at a position corresponding to the groove;
    (e2) impelling the polymer into the groove; and
    (e3) removing the part of the polymer which is outside the groove.

11. The method as claimed in claim 10, wherein the polymer is sucked into the groove by vacuuming.

12. The method as claimed in claim 1, wherein Step (e) further comprises:
    (e1) forming a plurality of vents to connect the groove to the second surface of the substrate;
    (e2) dispersing the polymer at a position corresponding to the groove;
    (e3) filling the groove and the vents with the polymer; and
    (e4) removing the part of the polymer which is outside the groove and the vents.

13. The method as claimed in claim 1, wherein Step (e) further comprises:
    (e1) depositing the polymer in the groove by spray coating; and
    (e2) removing the part of the polymer which is outside the groove.

14. The method as claimed in claim 13, wherein the polymer is atomized before depositing.

15. The method as claimed in claim 1, wherein the pillar of the substrate is removed by dry etching or wet etching.

16. The method as claimed in claim 1, wherein the conductive metal is copper.

17. The method as claimed in claim 1, wherein the second surface of the substrate is etched or ground.

* * * * *